(12) United States Patent
Ieki et al.

(10) Patent No.: US 6,727,766 B2
(45) Date of Patent: Apr. 27, 2004

(54) OSCILLATOR WITH DIELECTRIC RESONATOR AND ELECTRONIC APPARATUS USING THE SAME

(75) Inventors: Tsutomu Ieki, Yokohama (JP); Yutaka Ida, Yokohama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 169 days.

(21) Appl. No.: 09/971,973

(22) Filed: Oct. 5, 2001

(65) Prior Publication Data

US 2003/0107444 A1 Jun. 12, 2003

(30) Foreign Application Priority Data

Oct. 12, 2000 (JP) ........................................ 2000-312142

(51) Int. Cl.$^7$ ................................................. H03B 5/00
(52) U.S. Cl. ............ 331/96; 331/107 SL; 331/107 DP; 331/108 C; 333/219.1
(58) Field of Search ................................ 331/96, 117 D, 331/108 C, 107 SL, 177 V; 333/219.1, 246, 247

(56) References Cited

U.S. PATENT DOCUMENTS 5,187,451 A * 2/1993 Nakamoto et al. ............ 331/99
5,357,218 A 10/1994 Wingfield et al. ............ 331/96
5,373,262 A 12/1994 Yamamoto et al. ........... 331/96
6,445,345 B1 * 9/2002 Kamimoto et al. .. 343/700 MS

FOREIGN PATENT DOCUMENTS

| EP | 0893878 A2 | 1/1999 |
| JP | 63009203 | 1/1988 |
| JP | 10173439 | 6/1988 |
| JP | 8330816 | 12/1996 |

OTHER PUBLICATIONS

European Search Report dated Apr. 26, 2002.

* cited by examiner

*Primary Examiner*—Arnold Kinkead
(74) *Attorney, Agent, or Firm*—Dickstein, Shapiro, Morin & Oshinsky, LLP

(57) ABSTRACT

A dielectric substrate, a transistor, which is an active device, a varactor diode, which is a frequency-variable device, are mounted on one main surface of a package substrate to configure an oscillator. The dielectric substrate is made from a large-dielectric-constant dielectric having high temperature stability. A microstrip-line resonator is formed by thin-film-electrode forming. The microstrip-line resonator and the transistor constitute an oscillating circuit.

12 Claims, 4 Drawing Sheets

OSCILLATOR WITH DIELECTRIC RESONATOR AND ELECTRONIC APPARATUS USING THE SAME

BACKGROUND OF THE INVENTION

1. Field of the Invention

The present invention relates to high-frequency oscillators and electronic apparatus using the oscillators; for example, to an oscillator used as a local oscillator in a communication apparatus, and to other electronic apparatus using the oscillator.

2. Description of the Related Art

Conventional high-frequency oscillators have structures as disclosed, for example, in Unexamined Japanese Patent Application Publication No. Sho-63-9203 and Unexamined Japanese Patent Application Publication No. Hei-10-173439.

In Unexamined Japanese Patent Application Publication No. Sho-63-9203, an oscillator mainly including a dielectric substrate, a cylindrical dielectric resonator made from a large-dielectric-constant dielectric, a semiconductor device, and a metallic case is disclosed in an outlined manner. The dielectric resonator is mounted on the dielectric substrate through a support dielectric, is covered by the metallic case, resonates, for example, in TE01δ mode, and is electromagnetically coupled with a microstrip line formed on the dielectric substrate. The microstrip line is connected to the semiconductor device mounted on the dielectric substrate. These components together form an oscillating circuit having a resonating circuit section and an amplifying circuit section.

In Unexamined Japanese Patent Application Publication No. Hei-10-173439, an oscillator mainly including a multi-layer substrate, a stripline resonator formed on an internal layer of the multi-layer substrate, and a semiconductor device mounted on a surface of the multi-layer substrate is disclosed in an outlined manner. The stripline resonator is connected to the semiconductor device. These components together form an oscillating circuit having a resonating circuit section and an amplifying circuit section.

In the oscillator disclosed in Unexamined Japanese Patent Application Publication No. Sho-63-9203, however, since the dielectric resonator is placed on the dielectric substrate, it is very difficult to reduce positional shifts between the dielectric resonator and the microstrip line formed on the dielectric substrate, and it is also very difficult to reduce deviations in the oscillating frequency. In addition, because the cylindrical dielectric resonator is mounted on the dielectric substrate, the oscillator is relatively tall. It is difficult to make the oscillator low or compact.

In the oscillator disclosed in Unexamined Japanese Patent Application Publication No. Hei-10-173439, since the resonator has a low Q, deviations in the oscillating frequency become large and the stability of the frequency deteriorates. In addition, because the stripline resonator is formed on an internal layer of the multi-layer substrate, the stripline resonator needs to have a dielectric layer (dielectric substrate) made from the same material as that used for the multi-layer substrate. It is very difficult to select the most appropriate material for the dielectric layer to obtain a resonator which has a stable frequency with respect to temperature changes.

SUMMARY OF THE INVENTION

The present invention solves the foregoing problems. Accordingly, an oscillator according to the present invention has a low profile, a small amount of deviation of the oscillating frequency, and high temperature stability; and an electronic apparatus using the oscillator has these advantages as well.

In one aspect of the present invention, the oscillator includes a dielectric substrate on which a microstrip-line resonator and a coupling line coupled with the microstrip-line resonator are formed; an active device is connected to the coupling line and constitutes an oscillating circuit together with the microstrip-line resonator; a package substrate, on which the dielectric substrate is mounted, has a smaller dielectric constant than the dielectric substrate; and the active device is mounted on the package substrate. In the oscillator, a frequency-variable device may be mounted on the package substrate.

In another aspect of the present invention, the oscillator includes a dielectric substrate on which a microstrip-line resonator and a coupling line coupled with the microstrip-line resonator are formed; an active device connected to the coupling line and constituting an oscillating circuit together with the microstrip-line resonator; and a package substrate on which the dielectric substrate is mounted and which has a smaller dielectric constant than the dielectric substrate, wherein the active device is mounted on the dielectric substrate. In the oscillator, a frequency-variable device may be mounted on the dielectric substrate.

In the oscillator, a bias line and a bias resistor both for applying a bias voltage to the active device may be formed on the dielectric substrate.

In the oscillator, for manufacturing efficiency, the microstrip-line resonator and the coupling line may be formed at the same time by the same electrode forming method. The electrode forming method may be a thin-film-electrode forming method, such as evaporation or sputtering, for example. The microstrip-line resonator and the coupling line may be formed by photolithography. The electrode forming method may be a thick-film-electrode forming method such as screen printing, for example.

Efficiency may also be achieved by making the resonator and coupling line by the same method but at different times; or at the same time but by different or similar methods.

In the oscillator, the dielectric substrate may be mounted on the package substrate by die bonding. The dielectric substrate and the package substrate may be electrically connected by wire bonding. The dielectric substrate may be mounted on the package substrate by flip-chip mounting.

The dielectric substrate may have a relative permittivity of 20 or more.

The temperature characteristic of the dielectric substrate may be specified such that the temperature drift of the resonant frequency of the microstrip-line resonator is within 0.1% of the resonant frequency in a temperature range of 0° C. to 70° C.

In the oscillator, the package substrate may be an alumina substrate. The package substrate may be a resin substrate.

The oscillator may further include an electrically conductive cap for sealing the dielectric substrate mounted on the package substrate, and the active device.

In still another aspect of the present invention, an electronic apparatus includes an oscillator as described above.

With the above structures, an oscillator according to the present invention is made to have a low profile. In addition, the oscillator has a narrow oscillating frequency deviation. Furthermore, the oscillator has high temperature stability. In addition, when the active device is mounted on the dielectric substrate, the oscillator is compact and has a low profile.

When a frequency-variable device is mounted on the package substrate or on the dielectric substrate, the oscillator can serve as a voltage-controlled oscillator.

When the microstrip-line resonator and the coupling line are formed at the same time and/or by an identical or similar electrode forming method, or material, the oscillating frequency of the oscillator has a narrow deviation.

When the relative permittivity of the dielectric substrate is set to 20 or more, the microstrip-line resonator is made compact.

When the temperature characteristic of the dielectric substrate is specified such that the temperature drift of the resonant frequency of the microstrip-line resonator is within 0.1% of the resonant frequency in a temperature range of 0° C. to 70° C., high temperature stability is obtained.

When an electrically conductive cap is provided for sealing the dielectric substrate and the active device mounted on the package substrate, frequency stability is maintained against external electromagnetic interference.

In an electronic apparatus of the present invention, since an oscillator according to the present invention is used, a low profile and high performance are provided and high temperature stability is obtained.

Other features and advantages of the invention will be understood from the following description of embodiments thereof, with reference to the drawings, in which like references denote like elements and parts.

DESCRIPTION OF EMBODIMENTS OF THE INVENTION

Figure 1:
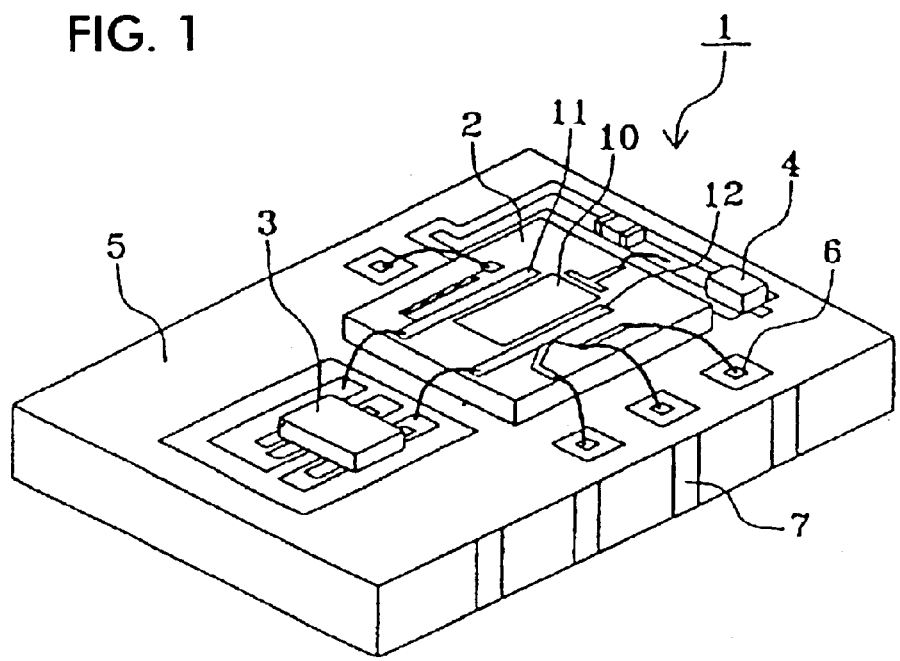
FIG. 1 is a perspective view of an oscillator according to an embodiment of the present invention.

FIG. 1 is a perspective view of an oscillator according to an embodiment of the present invention. The oscillator 1 shown in FIG. 1 is structured such that a dielectric substrate 2, a transistor 3 which is a resin-molded active device, and a varactor diode 4 which is a resin-molded frequency-variable device are mounted on one main surface of a package substrate 5.

The package substrate 5 is formed of an alumina substrate having a relatively small dielectric constant (a relative permittivity of about 9 to 10). In addition to lands for mounting the dielectric substrate 2, the transistor 3, and the varactor diode 4, the package substrate 5 has wires for connecting components, and connection lands 6 for wire bonding formed on one main surface thereof. Connection terminals 7 are formed at an end face thereof. The connection terminals 7 are connected to a ground electrode, to lands for mounting components, to wires, and to connection lands all formed on the package substrate 5, through surfaces or the inside of the package substrate 5.

The dielectric substrate 2 is a large-dielectric-constant dielectric substrate having a relatively high relative permittivity of about 30. A microstrip line is formed on one main surface thereof, and a ground electrode is formed on almost the entire area of the other main surface.

Figure 2:
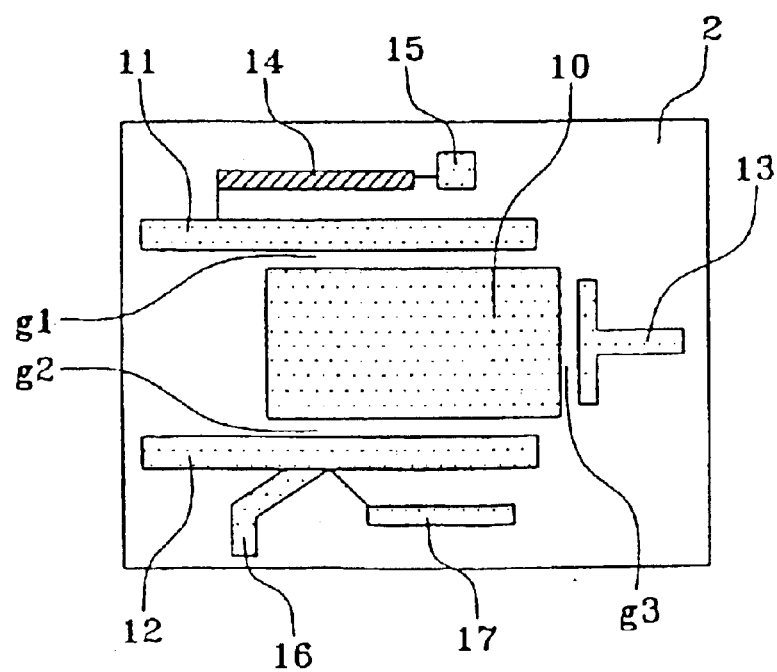
FIG. 2 is a plan of a dielectric substrate used for the oscillator shown in FIG. 1.

FIG. 2 is a plan of the dielectric substrate 2. As shown in FIG. 2, a microstrip-line resonator 10 which resonates at a half wavelength at about 10 GHz and which is open at both ends, coupling lines 11, 12, and 13, a resistor 14, a land 15, and bias lines 16 and 17 are formed on the one main surface of the dielectric substrate 2. The microstrip-line resonator 10 is disposed almost at the center of the dielectric substrate 2, and the coupling lines 11 and 12 are disposed at both sides thereof with gaps g1 and g2 being provided respectively. The coupling line 13 is disposed at one open end of the microstrip-line resonator 10 with a gap g3 being provided. A part of the coupling line 11 is connected to the connection land 15 through the resistor 14. A part of the coupling line 12 is connected to the bias lines 16 and 17. The resistor 14 and the bias lines 16 and 17 are used for applying a bias voltage to the transistor 3.

Thin-film electrode patterns are formed by photolithography technology on the one main surface of the dielectric substrate 2, preferably at the same time and by the same electrode forming technique and materials, to make all the transmission lines and electrodes other than the resistor 14.

The dielectric substrate 2 is made of a material having a dielectric constant and a thermal expansion rate both specified such that the temperature drift of the resonant frequency of the microstrip-line resonator 10 formed on the one main surface of the dielectric substrate 2 is within 0.1% of the resonant frequency at a temperature range of 0° C. to 70° C. In this case, since the resonant frequency of the microstrip-line resonator 10 is about 10 GHz, its temperature drift is within about 10 MHz.

Referring again to FIG. 1, the dielectric substrate 2 is connected to predetermined lands on the package substrate 5 by wire bonding. A meltable metal such as solder or electrically conductive adhesive is preferably used as the material for wire bonding. The transistor 3 and the varactor diode 4 are mounted on predetermined lands on the package substrate 5 by soldering. The coupling lines 11 and 12 formed on the dielectric substrate 2 are connected to the electrodes connected to terminals of the transistor 3 by wire bonding, and the coupling line 13 is connected to the electrode connected to a terminal of the varactor diode 4 also by wire bonding. The connection land 15 and the connection lines 16 and 17 formed on the dielectric substrate 2 are connected to the connection lands 6 formed on the package substrate 5, by wire bonding.

In the oscillator 1 configured in this way, an oscillating circuit is formed of the microstrip-line resonator 10 and the transistor 3, and oscillates at about 10 GHz. Since the microstrip-line resonator 10 is connected to the varactor diode 4 through the coupling line 13, a bias voltage applied to the varactor diode 4 can be changed to change the resonant frequency of the microstrip-line resonator 10, thereby changing the oscillating frequency of the oscillator 1. In other words, the oscillator 1 can serve as a voltage-controlled oscillator.

Since in the oscillator 1, the microstrip-line resonator 10 is formed on the dielectric substrate 2 having a large dielectric constant, the microstrip-line resonator 10 can be made compact and made to have a low profile, and therefore, the oscillator 1 can be made compact and made to have a low profile.

In addition, because the dielectric substrate 2 can be made from a material having a high Q value which is different from that used for the package substrate 5, the Q value of the microstrip-line resonator 10 itself can be increased.

Furthermore, since only the resonator and its peripheral circuits are formed on the dielectric substrate 2 having a large dielectric constant and the connection terminals 7 used for signal inputs and outputs are provided on the package substrate 5 having a relatively small dielectric constant, a problem caused by forming all components on a large-dielectric-constant substrate, that is, an increase in the parasitic capacitance generated at transmission lines and terminals is reduced, to prevent the high-frequency characteristic of the oscillator 1 from deteriorating.

If the package substrate 5 is formed of alumina, a lower cost is implemented. In addition, since the alumina substrate has high strength and good long term stability, the oscillator 1 has high reliability.

If the thin-film electrode patterns are formed by photolithography technology at the same time and by the identical electrode forming method and materials, to make the microstrip-line resonator 10 and the coupling lines 11, 12, and 13, the size of each electrode and their mutual positional relationships, more specifically, the sizes of the microstrip-line resonator 10 and the coupling lines 11, 12, and 13, and the gaps g1, g2, and g3 between them, have very high precision. Specifically, the dimensional precision can be set to 1 μm or less. Therefore, the precision of the resonant frequency of the microstrip-line resonator 10 is increased to make the deviation of the oscillating frequency of the oscillator 1 narrower.

Since material characteristics, such as the dielectric constant and the thermal expansion rate, of the dielectric substrate 2 are specified such that the temperature drift of the resonant frequency of the microstrip-line resonator 10 is within 0.1% of the resonant frequency at a temperature range of 0° C. to 70° C., the temperature drift of the microstrip-line resonator 10 is made very small, so that the temperature drift of the oscillator 1 is also small, thereby obtaining a high temperature stability.

Due to the synergy of a narrowed deviation and a reduced temperature drift, the oscillating frequency of the oscillator 1 has a narrow deviation over the entire operation temperature range.

Figure 3:
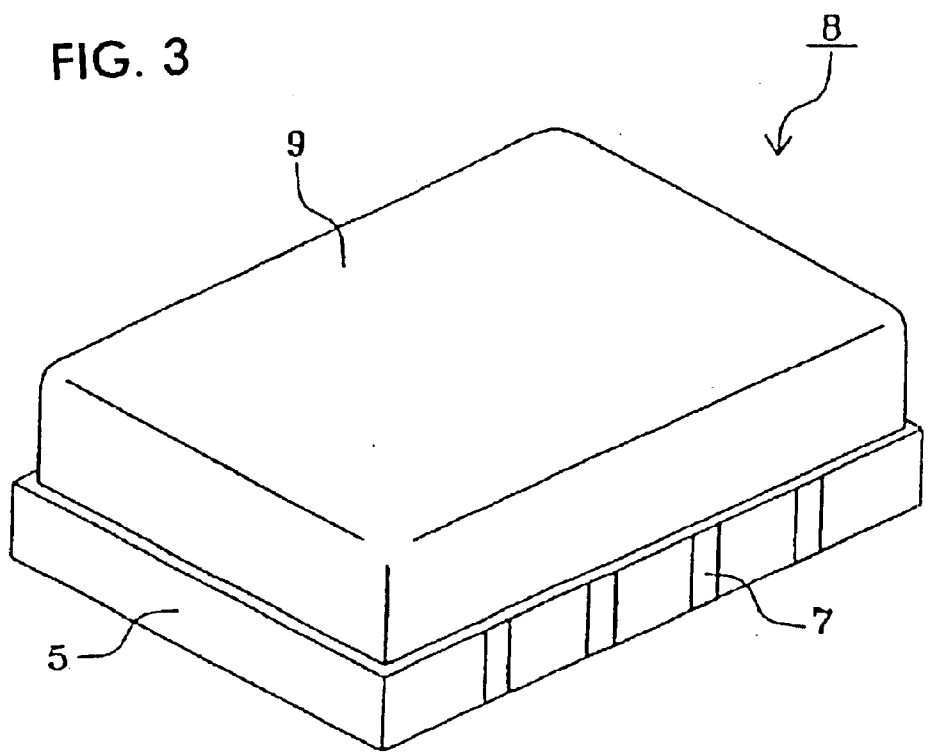
FIG. 3 is a perspective view of an oscillator according to another embodiment of the present invention.

FIG. 3 is a perspective view of an oscillator according to another embodiment of the present invention. In FIG. 3, the same symbols are assigned to the same portions as, or portions similar to, those shown in FIG. 1, and descriptions thereof are omitted.

In FIG. 3, the oscillator 8 is structured such that the oscillator 1 shown in FIG. 1 is provided with a metallic cap 9. With this structure, the dielectric substrate 2 and the transistor 3 are sealed by the package substrate 5 and the cap 9. The material of the cap 9 is not limited to metal. A cap made from a resin on which an electrically conductive film is formed may be used, for example.

Since the oscillator 8 is structured as described above, the breakage of the electrodes of the microstrip-line resonator 10 and other electrodes formed on the dielectric substrate 2, the breakage of the wires which connect between the dielectric substrate 2 and the package substrate 5, and the breakage of the transistor 3 are prevented. In addition, since the cap 9 also serves as an electromagnetic shield, the frequency of the oscillator 8 is stabilized against external electromagnetic interference.

Figure 4:
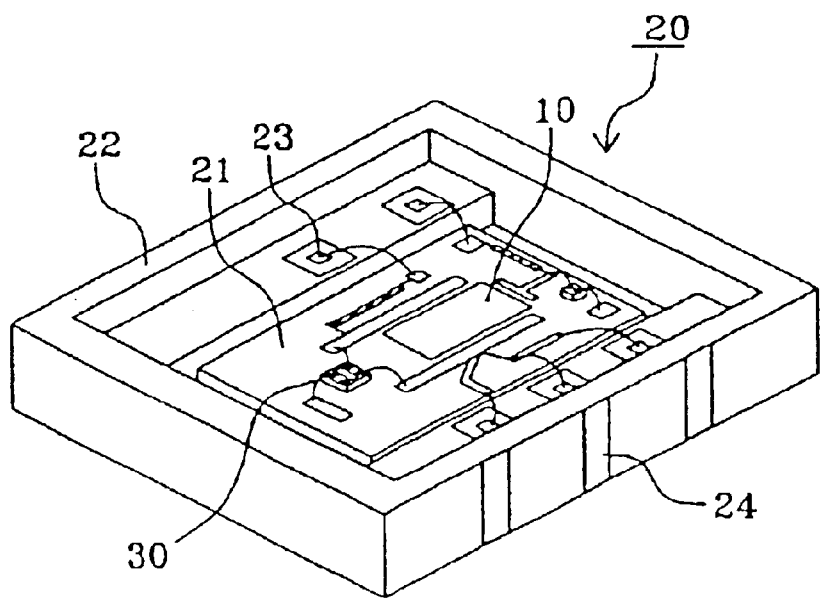
FIG. 4 is a perspective view of an oscillator according to still another embodiment of the present invention.

FIG. 4 is a perspective view of an oscillator according to still another embodiment of the present invention. The oscillator 20 shown in FIG. 4 is structured such that a dielectric substrate 21 is placed in a cavity formed at one main surface of a package substrate 22.

The package substrate 22 is formed of alumina. The dielectric substrate 21 is accommodated and also connection lands 23 for connecting between the dielectric substrate 21 and the package substrate 22 are formed in a cavity formed in one main surface of the package substrate 22. On an end face of the package substrate 22, connection terminals 24 are formed. The connection terminals 24 are connected to a ground electrode, lands for mounting components, wires, and connection lands all formed on, through, or inside the package substrate 22.

The dielectric substrate 21 is a large-dielectric-constant dielectric substrate having a relatively high relative permittivity of about 30. A microstrip line is formed on one main surface thereof, and a ground electrode is formed on almost the entire area of the other main surface.

Figure 5:
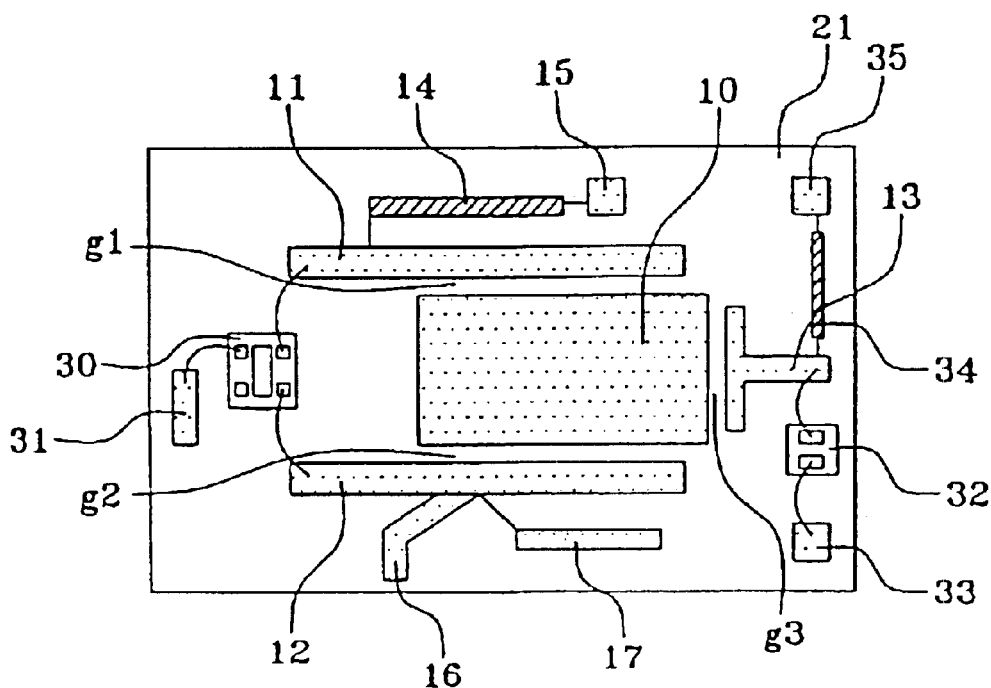
FIG. 5 is a plan of a dielectric substrate used for the oscillator shown in FIG. 4.

FIG. 5 is a plan of the dielectric substrate 21. In FIG. 5, the same symbols are assigned to the same portions as, or portions similar to, those shown in FIG. 2, and descriptions thereof are omitted.

On the dielectric substrate 21 shown in FIG. 5, in addition to the electrodes formed on the dielectric substrate 2 shown in FIG. 2, lands 31, 33, and 35 and a bias line 34 are formed. The coupling line 13 is connected to the land 35 through the bias line 34. A bare-chip transistor 30 and a bare-chip varactor diode 32 are mounted on the dielectric substitute 21 by die bonding, by a meltable metal such as solder or an electrically conductive or insulating adhesive, for example. The coupling lines 11 and 12 are connected to the transistor 30 by wire bonding, and the transistor 30 is connected to the land 31 also by wire bonding. The land 31 is grounded. The coupling line 13 is connected to the varactor diode 32 by wire bonding, and the varactor diode 32 is connected to the land 33 by wire bonding.

In the same way as for the dielectric substrate 2 shown in FIG. 2, patterns are formed by photolithography technology on thin-film electrodes formed on one main surface of the dielectric substrate 21 at the same time by identical electrode forming methods and materials to make all the transmission lines and electrodes other than the resistor 14. Therefore, good manufacturing precision is obtained and the resonant frequency of the microstrip-line resonator 10 has a narrow deviation.

The dielectric constant and the thermal expansion rate of the material of the dielectric substrate 21 are specified such that the temperature drift of the resonant frequency of the microstrip-line resonator 10 formed on the one main surface is within 0.1% of the resonant frequency at a temperature range of 0° C. to 70° C., in the same way as for the material of the dielectric substrate 2 shown in FIG. 2. Therefore, also in this case, since the resonant frequency of the microstrip-line resonator 10 is about 10 GHz, its temperature drift is within about 10 MHz.

Referring again to FIG. 4, the dielectric substrate 21 is mounted in the cavity of the package substrate 22 by die bonding. As a material for die bonding, a meltable metal such as solder or electrically conductive adhesive is used, for example. The lands 15 and 35 and the bias lines 16 and 17 formed on the dielectric substrate 21 are connected by wire bonding to the connection lands 23 formed on the package substrate 22.

Also in the oscillator 20 configured in this way, an oscillating circuit is formed of the microstrip-line resonator 10 and the transistor 30, and oscillates at about 10 GHz in the same way as in the oscillator 1 shown in FIG. 1. Since the microstrip-line resonator 10 is connected to the varactor diode 32 through the coupling line 13, a bias voltage applied to the varactor diode 32 can be changed to change the resonant frequency of the microstrip-line resonator 10, thereby changing the oscillating frequency of the oscillator 20. In other words, the oscillator 20 can serve as a voltage-controlled oscillator.

The oscillator 20 configured as described above have the same advantages as the oscillator 1, such as compactness, a low profile, the prevention of deterioration of high-frequency characteristics, a low cost, reliability improvement, a narrow deviation, and the improvement of temperature stability.

In addition, since the oscillator 20 uses a bare-chip transistor and varactor diode, it can be more compact than the oscillator 1.

Figure 6:
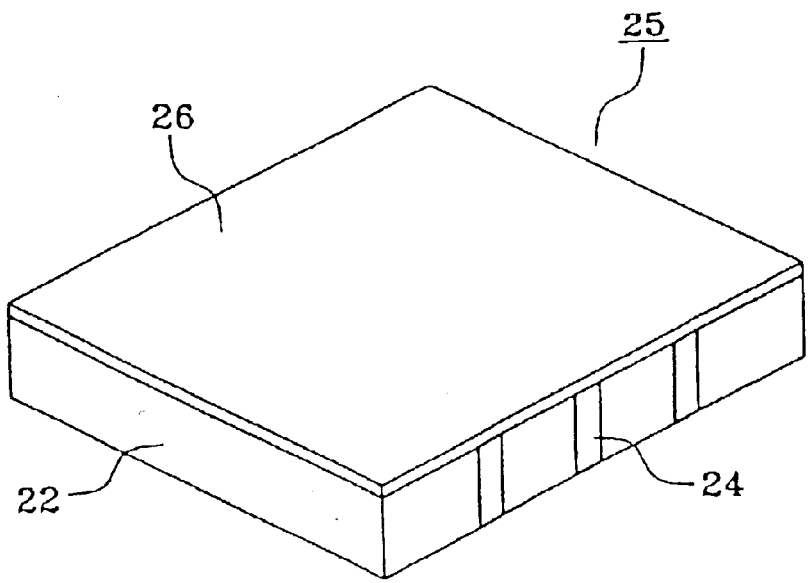
FIG. 6 is a perspective view of an oscillator according to yet another embodiment of the present invention.

FIG. 6 is a perspective view of an oscillator 25 according to yet another embodiment of the present invention. In FIG. 6, the same symbols are assigned to the same portions as, or portions similar to, those shown in FIG. 4, and descriptions thereof are omitted.

In FIG. 6, the oscillator 20 shown in FIG. 4 is provided with a plane, metallic cap 26 so as to cover the cavity of the package substrate 22. Therefore, the dielectric substrate 21 and the transistor 30 and the varactor diode 32 mounted thereon are sealed by the package substrate 22 and the cap 26. The cap 26 is not limited to being a metallic cap. It may be a cap made from a resin on which an electrically conductive film is formed.

Since the oscillator 25 is structured as described above, the breakage of the bare-chip transistor 30 and the bare-chip varactor diode 32 and the electrodes of the microstrip-line resonator 10 and other electrodes, and the breakage of the wires which connect between the dielectric substrate 21 and the package substrate 22 are prevented. In addition, since the cap 26 also serves as an electromagnetic shield, the frequency of the oscillator 25 is stabilized against external electromagnetic interference.

A varactor diode is provided in the oscillator of each of the above embodiments as a frequency-variable device. A frequency-variable device is not necessary required. The present invention can also be applied to an oscillator having no frequency variable function.

In each of the above embodiments, a thin-film-electrode forming method is used to form electrodes on a dielectric substrate, preferably at the same time. Thick-film-electrode forming methods, such as screen printing, may also be used to form the electrodes at the same time. In this case, both electrodes and other patterns can be formed at the same time by the thick-film method.

It may be possible not to form all electrodes at the same time irrespective of whether thin-film-electrode forming or thick-film-electrode forming is used, and further, two or more different electrode forming methods may be used, either at the same time or at different times. The electrodes are preferably made of the same material in a single process as described above, but may also be made of different materials.

In each of the above-described embodiments, a dielectric substrate is mounted on a package substrate by die bonding. The dielectric substrate may be flip-chip-mounted on the package substrate.

In each embodiment described above, the relative permittivity of a dielectric substrate is set to 30. The relative permittivity of the dielectric substrate needs to be 20 or more, which is sufficiently higher than, for example, the relative permittivity, 10, of an alumina substrate. The higher the relative permittivity is, the more compact a microstrip-line resonator formed there can be made.

In each embodiment described above, an alumina substrate is used as a package substrate. A resin substrate may be used.

Figure 7:
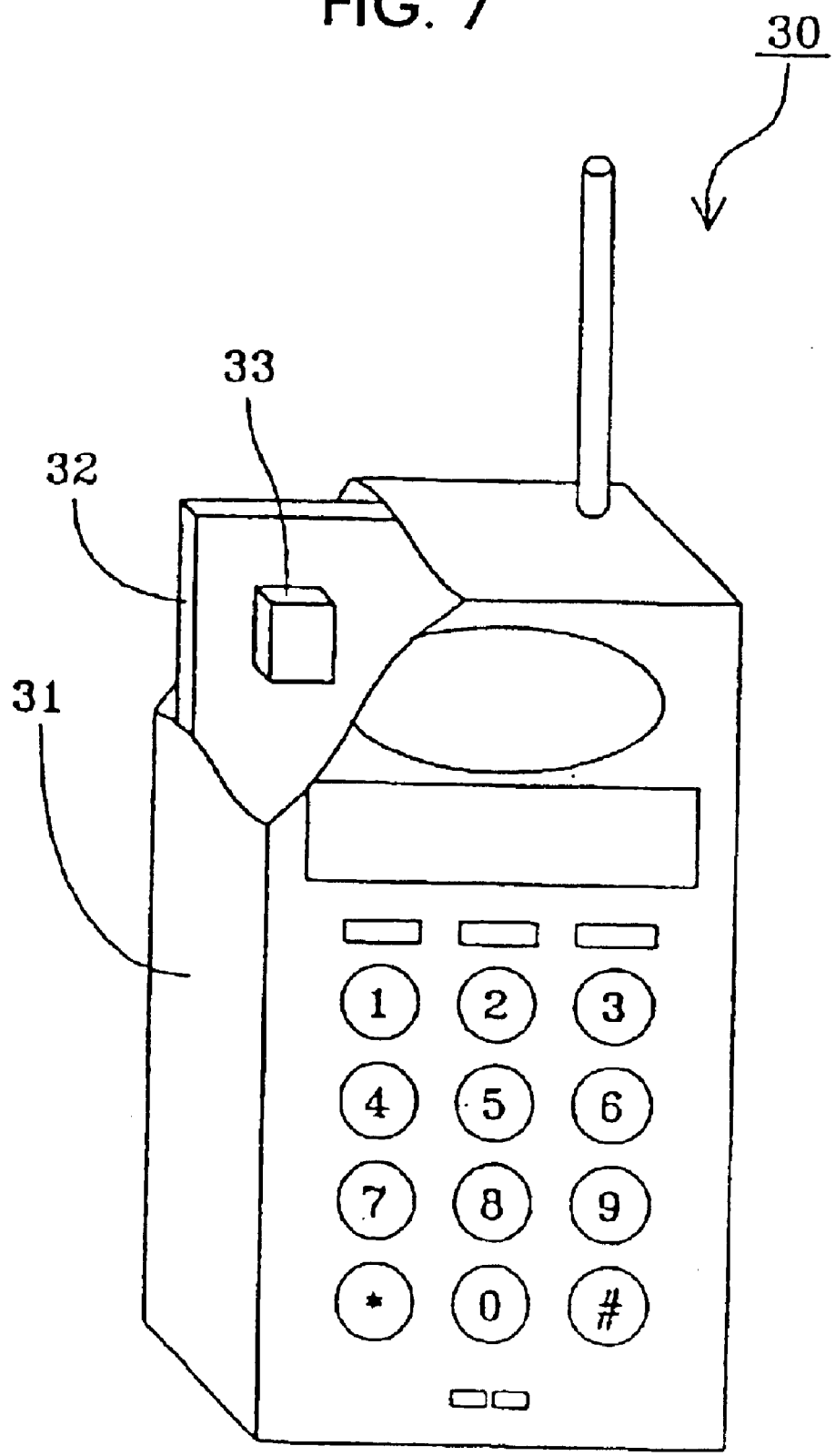
FIG. 7 is a perspective view of an electronic apparatus according to an embodiment of the present invention.

FIG. 7 is a perspective view of an electronic apparatus according to an embodiment of the present invention. In FIG. 7, a portable telephone 30, which is one type of electronic apparatus, is provided with a casing 31, a printed circuit board 32 disposed in the casing 31, and an oscillator 33 according to the present invention mounted on the printed circuit board 32.

Since the oscillator 33 according to the present invention is used, the cost of the portable telephone 30 structured as described above is reduced and the performance thereof is improved.

In FIG. 7, the portable telephone is shown as an electronic apparatus of the present invention. The apparatus is not limited to the portable telephone. The present invention can be applied to any electronic apparatus using an oscillator according to the present invention, such as a personal computer having a communication function and a portable information terminal.

Although the present invention has been described in relation to particular embodiments thereof, many other variations and modifications and other uses will become apparent to those skilled in the art. Therefore, the present invention is not limited by the specific disclosure herein.

What is claimed is:

1. An oscillator comprising:
    a dielectric substrate having a microstrip-line resonator and a coupling line coupled with the microstrip-line resonator formed thereon, the dielectric substrate having a relative permittivity of more than 20;
    an active device connected to the coupling line and constituting an oscillating circuit together with the microstrip-line resonator; and
    a package substrate on which the dielectric substrate is mounted and which has a smaller dielectric constant than the dielectric substrate,
    wherein the active device is mounted on the package substrate.

2. An oscillator according to claim 1, further comprising a frequency-variable device mounted on the package substrate and connected to a said oscillating circuit.

3. An oscillator comprising:
    a dielectric substrate having a microstrip-line resonator and a coupling line coupled with the microstrip-line resonator formed thereon, the dielectric substrate having a relative permittivity of more than 20;
    an active device connected to the coupling line and constituting an oscillating circuit together with the microstrip-line resonator; and
    a package substrate on which the dielectric substrate is mounted and which has a smaller dielectric constant than the dielectric substrate,
    wherein the active device is mounted on the dielectric substrate.

4. An oscillator according to claim 3, further comprising a frequency-variable device mounted on the dielectric substrate and connected to said oscillating circuit.

5. An oscillator according to one of claims 1 and 3, further comprising a bias line and a bias resistor both for applying a bias voltage to the active device which are formed on the dielectric substrate.

6. An oscillator according to one of claims 1 and 3, wherein the microstrip-line resonator and the coupling line are formed at the same time.

7. An oscillator according to claim 1 or claim 3, wherein the dielectric substrate is mounted on the package substrate by die bonding.

8. An oscillator according to claim 7, wherein the dielectric substrate and the package substrate are electrically connected by wire bonding.

9. An oscillator according to claim 1 or claim 3, wherein the dielectric substrate is mounted on the package substrate by flip-chip mounting.

10. An oscillator comprising:
   a dielectric substrate having a microstrip-line resonator and a coupling line coupled with the microstrip-line resonator formed thereon;
   an active device connected to the coupling line and constituting an oscillating circuit together with the microstrip-line resonator;
   a package substrate on which the dielectric substrate is mounted and which has a smaller dielectric constant than the dielectric substrate,
   wherein the active device is mounted on the package substrate; and
   wherein a temperature characteristic of the dielectric substrate is specified such that a temperature drift of the resonant frequency of the microstrip-line resonator is within 0.1% of the resonant frequency in a temperature range of 0° C. to 70° C.

11. An electronic apparatus comprising a communications circuit including at least one of a transmission circuit and a reception circuit, said communications circuit including an oscillator according to claim 1 or claim 3.

12. An oscillator comprising:
   a dielectric substrate having a microstrip-line resonator and a coupling line coupled with the microstrip-line resonator formed thereon an active device connected to the coupling line and constituting an oscillating circuit together with the microstrip-line resonator; and
   a package substrate on which the dielectric substrate is mounted and which has a smaller dielectric constant than the dielectric substrate,
   wherein the active device is mounted on dielectric substrate; and
   wherein a temperature characteristic of the dielectric substrate is specified such that a temperature drift of the resonant frequency of the microstrip-line resonator is within 0.1% of the resonant frequency in a temperature range of 0° C. to 70° C.

* * * * *